United States Patent
Jung et al.

(10) Patent No.: US 9,613,677 B1
(45) Date of Patent: Apr. 4, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Hun Sam Jung, Icheon-si (KR); Min Chang Kim, Seoul (KR); Chang Hyun Kim, Seoul (KR); Do Yun Lee, Yongin-si (KR); Jae Jin Lee, Gwangju-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/090,790

(22) Filed: Apr. 5, 2016

(30) Foreign Application Priority Data

Jan. 5, 2016 (KR) .................. 10-2016-0001234

(51) Int. Cl.
*G11C 8/00* (2006.01)
*G11C 11/406* (2006.01)
*G11C 11/4096* (2006.01)
*G11C 11/408* (2006.01)

(52) U.S. Cl.
CPC .......... *G11C 11/406* (2013.01); *G11C 11/408* (2013.01); *G11C 11/4096* (2013.01)

(58) Field of Classification Search
CPC .... G11C 11/401; G11C 11/402; G11C 11/406
USPC ............................................ 365/230.01, 222
See application file for complete search history.

(56) References Cited

U.S. PATENT DOCUMENTS

| | | | |
|---|---|---|---|
| 6,859,407 B1 | 2/2005 | Suh | |
| 8,953,403 B1* | 2/2015 | Song | G11C 11/40618 365/222 |
| 2005/0243627 A1* | 11/2005 | Lee | G11C 11/406 365/222 |
| 2011/0161578 A1* | 6/2011 | Kim | G11C 11/406 711/106 |

FOREIGN PATENT DOCUMENTS

KR  1020070087477 A  8/2007

* cited by examiner

*Primary Examiner* — Han Yang
(74) *Attorney, Agent, or Firm* — William Park & Associates Ltd.

(57) ABSTRACT

A semiconductor system includes a first semiconductor device and a second semiconductor device. The first semiconductor device outputs an external command and external addresses. The second semiconductor device generates an internal active command in response to the external command, generates active addresses in response to the external addresses, generates a refresh signal and refresh addresses in response to the internal active command, performs an internal operation in response to the internal active command and the active addresses, and performs a refresh operation in response to the refresh signal and the refresh addresses.

23 Claims, 12 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2016-0001234, filed on Jan. 5, 2016, which is incorporated herein by reference in its entirety.

BACKGROUND

1. Technical Field

Embodiments of the present disclosure generally relate to semiconductor devices configured for performing a refresh operation and semiconductor systems including the same.

2. Related Art

Dynamic random access memory (DRAM) devices among memory semiconductor devices may lose data stored in their memory cells as time elapses even while their power supplies are applied thereto, in contrast to static random access memory (SRAM) devices or flash memory devices. In order to prevent the data stored in the DRAM cells from being lost, the DRAM devices may be accompanied, basically, with an operation for rewriting the data from external systems in a certain period, which is called "a refresh operation". Usually, such a refresh operation is carried out, in retention times that are inherent in memory cells of banks, by activating word lines at least once or more, and sensing and amplifying data of the memory cells. The retention time is a time for which data can be maintained without a refresh operation after being written into a memory cell. Generally, DRAM devices accompanied with the refresh operation may perform an internal operation such as a read operation or a write operation.

SUMMARY

According to an embodiment, a semiconductor system is provided. The semiconductor system includes a first semiconductor device and a second semiconductor device. The first semiconductor device outputs an external command and external addresses. The second semiconductor device generates an internal active command based on the external command, generates active addresses based on the external addresses, generates a refresh signal and refresh addresses based on the internal active command, performs an internal operation based on the internal active command and the active addresses, and performs a refresh operation based on the refresh signal and the refresh addresses.

According to an embodiment, a semiconductor device is provided. The semiconductor device includes an internal operation control circuit, a refresh control circuit and a refresh operation control circuit. The internal operation control circuit performs an internal operation based on an internal active command and active addresses. The refresh control circuit generates a refresh signal and refresh addresses based on the internal active command. The refresh operation control circuit performs a refresh operation based on the refresh signal and the refresh addresses.

According to an embodiment, a semiconductor device is provided. The semiconductor device includes an address comparison circuit, a refresh signal generation circuit and a refresh operation control circuit. The address comparison circuit generates a control signal according to a comparison result of refresh addresses and active addresses. The refresh addresses are generated based on an internal active command. The refresh signal generation circuit generates a refresh signal based on the control signal. The refresh operation control circuit is configured for performing a refresh operation based on the refresh signal and the refresh addresses.

According to an embodiment, a semiconductor device is provided. The semiconductor device includes a refresh control circuit. The refresh control circuit prevents a refresh operation if active addresses corresponding to a memory block are the same as refresh addresses corresponding to the memory block during an internal operation.

The refresh control circuit prevents the refresh operation if the active addresses correspond to a memory block immediately adjacent to the memory block corresponding to the refresh addresses.

According to an embodiment, a semiconductor device is provided. The semiconductor device includes a refresh control circuit. The refresh control circuit prevents a refresh operation, during an internal operation, if active addresses correspond to a memory block immediately adjacent to a memory block corresponding to refresh addresses.

According to an embodiment, a semiconductor device is provided. The semiconductor device includes a refresh control circuit. The refresh control circuit prevents a refresh operation, during an internal operation, if active addresses correspond to a first memory block and refresh addresses correspond to a second memory block. The first and second memory blocks use the same sense amplifier.

DETAILED DESCRIPTION

Various embodiments may be directed to semiconductor devices performing a refresh operation and semiconductor systems including the same.

Various embodiments of the present disclosure will be described hereinafter with reference to the accompanying drawings. However, the embodiments described herein are for illustrative purposes only and are not intended to limit the scope of the present disclosure.

Figure 1:
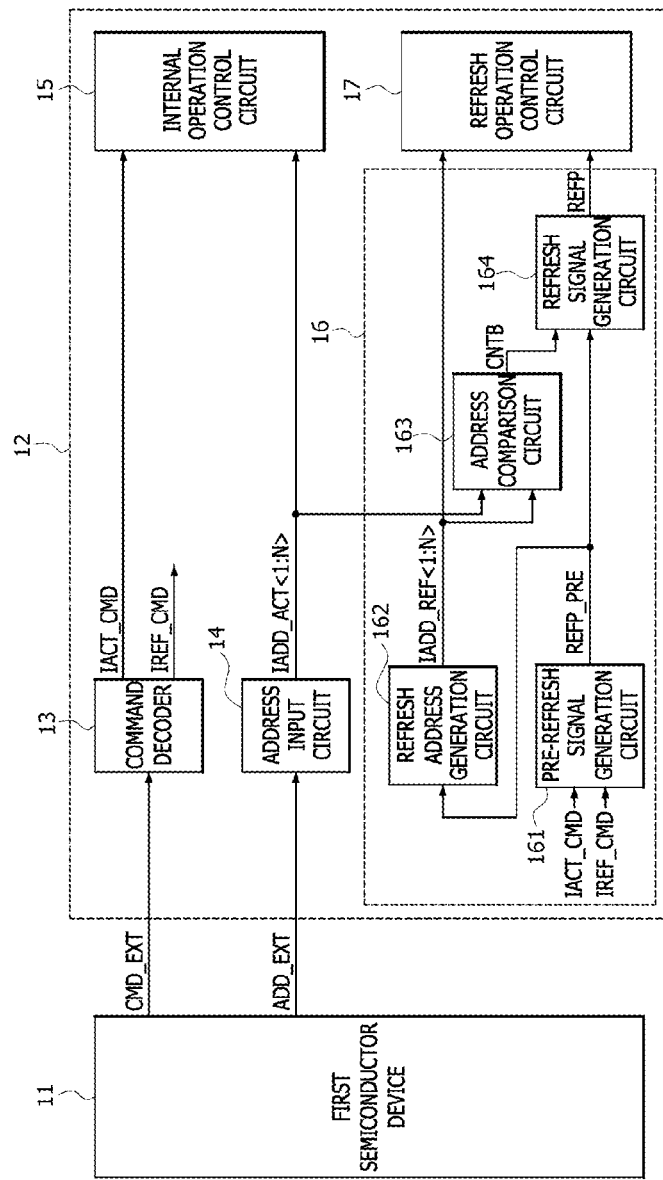
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 11 and a second semiconductor device 12.

The first semiconductor device 11 may output an external command CMD_EXT and an external address ADD_EXT. Each of the external command CMD_EXT and the external address ADD_EXT may include a plurality of bits. The external command CMD_EXT and the external address ADD_EXT may be transmitted through the same line or the same lines. Alternatively, the external address ADD_EXT may be transmitted through some lines among a plurality of lines that transmit the external command CMD_EXT.

The second semiconductor device 12 may include a command decoder 13, an address input circuit 14, an internal operation control circuit 15, a refresh control circuit 16, and a refresh operation control circuit 17.

The command decoder 13 may decode the external command CMD_EXT to generate an internal active command IACT_CMD or an internal refresh command IREF_CMD. If the external command CMD_EXT has a logic level combination corresponding to the internal active command IACT_CMD, the command decoder 13 may generate the internal active command IACT_CMD. If the external command CMD_EXT has a logic level combination corresponding to the internal refresh command IREF_CMD, the command decoder 13 may generate the internal refresh command IREF_CMD. The internal active command IACT_CMD may include a pulse for executing an internal operation of the second semiconductor device 12. The internal operation may include a read operation and a write operation. The internal refresh command IREF_CMD may include a pulse for executing a refresh operation of the second semiconductor device 12.

The address input circuit 14 may generate active addresses IADD_ACT<1:N> in response to the external address ADD_EXT. The active addresses IADD_ACT<1:N> may include N-number of bits. A number "N" may be set to be a natural number. The active addresses IADD_ACT<1:N> may include addresses for selecting and activating a memory bank, a memory block and a word line.

The internal operation control circuit 15 may perform an internal operation in response to the internal active command IACT_CMD and the active addresses IADD_ACT<1:N>. The internal operation may include a read operation and a write operation. If a pulse of the internal active command IACT_CMD is generated, the internal operation control circuit 15 may control to activate a word line of a memory block selected by the active addresses IADD_ACT<1:N> and to execute the internal operation with memory cells connected to the activated word line.

The refresh control circuit 16 may include a pre-refresh signal generation circuit 161, a refresh address generation circuit 162, an address comparison circuit 163, and a refresh signal generation circuit 164.

The pre-refresh signal generation circuit 161 may generate a pre-refresh signal REFP_PRE in response to the internal active command IACT_CMD and the internal refresh command IREF_CMD. If the pulse of the internal active command IACT_CMD is generated, the pre-refresh signal generation circuit 161 may generate a pulse of the pre-refresh signal REFP_PRE. If a pulse of the internal refresh command IREF_CMD is generated, the pre-refresh signal generation circuit 161 may generate a pulse of the pre-refresh signal REFP_PRE. For example, if an internal operation or a refresh operation is performed, the pre-refresh signal generation circuit 161 may generate the pulse of the pre-refresh signal REFP_PRE.

The refresh address generation circuit 162 may generate refresh addresses IADD_REF<1:N> which are counted in response to the pre-refresh signal REFP_PRE. The refresh addresses IADD_REF<1:N> may include N-number of bits. A number "N" may be set to be a natural number. The refresh addresses IADD_REF<1:N> may include an address for selecting and activating a memory bank, a memory block, and a word line. The refresh address generation circuit 162 may generate the refresh addresses IADD_REF<1:N> which are counted whenever the pre-refresh signal REFP_PRE is generated. The refresh address generation circuit 162 may count block addresses after all of word line addresses included in the refresh addresses IADD_REF<1:N> are counted.

The address comparison circuit 163 may compare the active addresses IADD_ACT<1:N> with the refresh addresses IADD_REF<1:N> to generate a control signal CNTB. The address comparison circuit 163 may compare first to third active addresses IADD_ACT<1:3> among the active addresses IADD_ACT<1:N> with first to third refresh addresses IADD_REF<1:3> among the refresh addresses IADD_REF<1:N> to generate the control signal CNTB. The first to third active addresses IADD_ACT<1:3> and the first to third the refresh addresses IADD_REF<1:3> may have logic level combinations corresponding to memory blocks. For example, a first memory block (not illustrated) may be activated if the first to third active addresses IADD_ACT<1:3> have a logic level combination of "000", a second memory block (not illustrated) immediately adjacent to the first memory block (not illustrated) may be activated if the first to third active addresses IADD_ACT<1:3> have a logic level combination of "001", and a third memory block (not illustrated) immediately adjacent to the second memory block (not illustrated) may be activated if the first to third active addresses IADD_ACT<1:3> have a logic level combination of "010". The logic level combination of "001" of the first to third active addresses IADD_ACT<1:3> means that the first active address IADD_ACT<1> has a logic high level ("1"), the second active address IADD_ACT<2> has a logic low level ("0"), and the third active address IADD_ACT<3> has a logic low level ("0"). A method of selecting the memory blocks using the first to third the refresh addresses IADD_REF<1:3> may be the same as the method of selecting the memory blocks using the first to third active addresses IADD_ACT<1:3>. In first to third memory blocks (not illustrated), two adjacent memory blocks may share a sense amplifier. If an internal operation and a refresh operation are simultaneously performed in the same memory block, interference between signals may occur causing a malfunction. If the refresh operation is performed in one of two adjacent memory blocks and the internal operation is performed in the other of the two adjacent memory blocks, interference between signals may also occur because the two adjacent memory blocks share a single sense amplifier. Hence, if a memory block corresponding to the active addresses IADD_ACT<1:N> is the same as a memory block corresponding to the refresh addresses IADD_REF<1:3> during the internal operation, the address comparison circuit 163 may generate the control signal CNTB which is enabled to block the refresh operation. Moreover, if a memory block corresponding to the active addresses IADD_ACT<1:N> is immediately adjacent to a memory block corresponding to the refresh addresses IADD_REF<1:3> during the internal operation, the address comparison circuit 163 may generate the control signal CNTB which is enabled to block the refresh operation. The address comparison circuit 163 may generate the control signal CNTB which is disabled in a time period that the internal operation is not performed. Although the above embodiments are described in conjunction with an example in which two adjacent memory blocks among eight memory blocks share a single sense amplifier, the present disclosure is not limited thereto. For example, in some embodiments, two adjacent memory blocks among nine or more memory blocks may share a single sense amplifier or three or more memory blocks among a plurality of memory blocks may share a single sense amplifier.

The refresh signal generation circuit 164 may buffer the pre-refresh signal REFP_PRE in response to the control signal CNTB to generate a refresh signal REFP. If the control signal CNTB is enabled, the refresh signal generation circuit 164 may block generation of a pulse of the refresh signal REFP. If the control signal CNTB is disabled, the refresh signal generation circuit 164 may delay a pulse of the pre-refresh signal REFP_PRE to generate the refresh signal REFP.

The refresh operation control circuit 17 may perform the refresh operation in response to the refresh signal REFP and the refresh addresses IADD_REF<1:N>. If the pulse of the refresh signal REFP is generated, the refresh operation control circuit 17 may control to activate a word line of a memory block selected by the refresh addresses IADD_REF<1:N> and to execute the refresh operation of memory cells connected to the activated word line.

Figure 2:
FIG. 2 is a circuit diagram of a pre-refresh signal generation circuit included in the semiconductor system illustrated in FIG. 1.

Referring to FIG. 2, the pre-refresh signal generation circuit 161 may include logic gates, for example but not limited to, a NOR gate NOR21 and an inverter IV21. The NOR gate NOR21 may perform a NOR operation of the internal active command IACT_CMD and the internal refresh command IREF_CMD to output a result of the NOR operation. The inverter IV21 may inversely buffer an output signal of the NOR gate NOR21 to output the inversely buffered signal as the pre-refresh signal REFP_PRE. For example, if the internal active command IACT_CMD includes a pulse having a logic high level, the pre-refresh signal generation circuit 161 may output the pre-refresh signal REFP_PRE including a pulse having a logic high level. If the internal refresh command IREF_CMD includes a pulse having a logic high level, the pre-refresh signal generation circuit 161 may output the pre-refresh signal REFP_PRE including a pulse having a logic high level.

Figure 3:
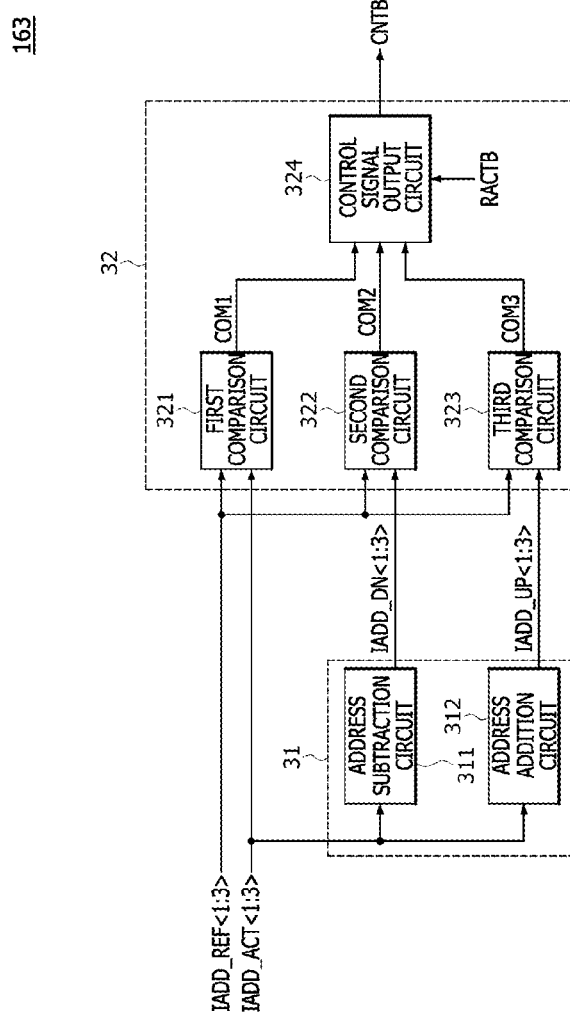
FIG. 3 is a block diagram of an address comparison circuit included in the semiconductor system illustrated in FIG. 1.

Referring to FIG. 3, the address comparison circuit 163 may include an address adjustment circuit 31 and a control signal generation circuit 32.

The address adjustment circuit 31 may include an address subtraction circuit 311 and an address addition circuit 312.

The address subtraction circuit 311 may, for example, receive the first to third active addresses IADD_ACT<1:3> to generate first to third subtraction addresses IADD_DN<1:3>. The address subtraction circuit 311 may subtract one bit from the first to third active addresses IADD_ACT<1:3> to generate the first to third subtraction addresses IADD_DN<1:3> corresponding to a memory block immediately adjacent to a memory block corresponding to the first to third active addresses IADD_ACT<1:3>. The memory block corresponding to the first to third active addresses IADD_ACT<1:3> may share a sense amplifier with the memory block corresponding to the first to third subtraction addresses IADD_DN<1:3>.

The address addition circuit 312 may receive the first to third active addresses IADD_ACT<1:3> to generate first to third addition addresses IADD_UP<1:3>. The address addition circuit 312 may add one bit to the first to third active addresses IADD_ACT<1:3> to generate the first to third addition addresses IADD_UP<1:3> corresponding to a memory block immediately adjacent to a memory block corresponding to the first to third active addresses IADD_ACT<1:3>. The memory block corresponding to the first to third active addresses IADD_ACT<1:3> may share a sense amplifier with the memory block corresponding to the first to third addition addresses IADD_UP<1:3>.

The control signal generation circuit 32 may include a first comparison circuit 321, a second comparison circuit 322, a third comparison circuit 323, and a control signal output circuit 324.

The first comparison circuit 321 may compare the first to third refresh addresses IADD_REF<1:3> with the first to third active addresses IADD_ACT<1:3> to generate a first comparison signal COM1. If the first to third refresh addresses IADD_REF<1:3> are the same as the first to third active addresses IADD_ACT<1:3>, the first comparison circuit 321 may generate the first comparison signal COM1 having a logic low level.

The second comparison circuit 322 may compare the first to third refresh addresses IADD_REF<1:3> with the first to third subtraction addresses IADD_DN<1:3> to generate a second comparison signal COM2. If the first to third refresh addresses IADD_REF<1:3> are the same as the first to third subtraction addresses IADD_DN<1:3>, the second comparison circuit 322 may generate the second comparison signal COM2 having a logic low level.

The third comparison circuit 323 may compare the first to third refresh addresses IADD_REF<1:3> with the first to third addition addresses IADD_UP<1:3> to generate a third comparison signal COM3. If the first to third refresh addresses IADD_REF<1:3> are the same as the first to third addition addresses IADD_UP<1:3>, the third comparison circuit 323 may generate the third comparison signal COM3 having a logic low level.

The control signal output circuit 324 may generate the control signal CNTB from the first to third comparison signals COM1, COM2, and COM3 in response to an internal operation period signal RACTB. The internal operation period signal RACTB may be a signal which is enabled to a logic low level during a time period in which the internal operation is performed. If the internal operation period signal RACTB is enabled, the control signal output circuit 324 may generate the control signal CNTB which is enabled to have a logic low level when at least one of the first to third comparison signals COM1, COM2, and COM3 has a logic low level. If the internal operation period signal RACTB is disabled, the control signal output circuit 324 may generate the control signal CNTB which is disabled to have a logic high level.

Figure 4:
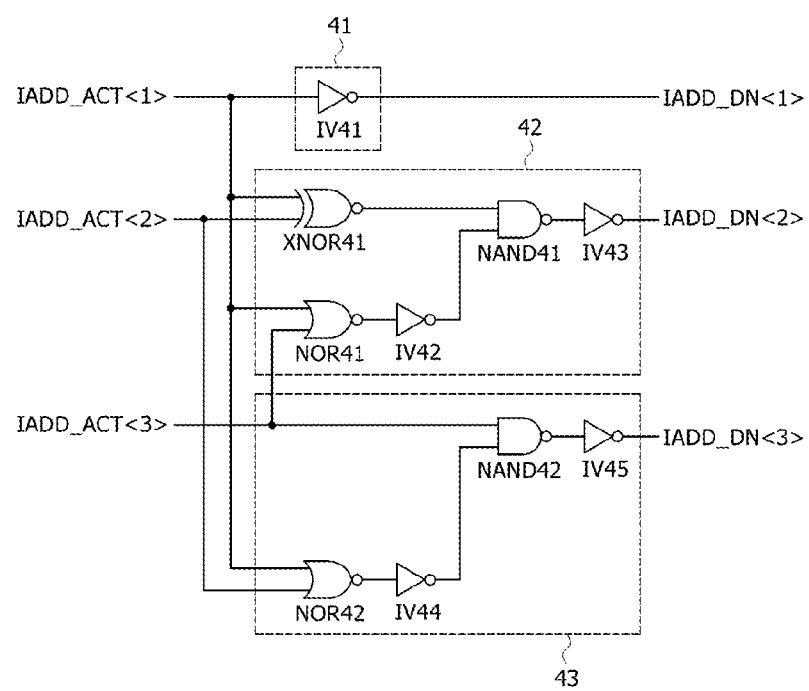
FIG. 4 is a circuit diagram of an address subtraction circuit included in the address comparison circuit illustrated in FIG. 3.

Referring to FIG. 4, the address subtraction circuit 311 may include a first subtraction address generation circuit 41, a second subtraction address generation circuit 42, and a third subtraction address generation circuit 43.

The first subtraction address generation circuit 41 may include an inverter IV41. The IV41 may inversely buffer the first active address IADD_ACT<1> to generate the first subtraction address IADD_DN<1>.

The second subtraction address generation circuit 42 may include, logic gates for example but not limited to, an exclusive NOR gate XNOR41, a NOR gate NOR41, inverters IV42 and IV43, and a NAND gate NAND41. The exclusive NOR gate XNOR41 may perform an exclusive NOR operation of the first active address IADD_ACT<1> and the second active address IADD_ACT<2> to output a result of the exclusive NOR operation. The NOR gate NOR41 may perform a NOR operation of the first active address IADD_ACT<1> and the third active address IADD_ACT<3> to output a result of the NOR operation. The inverter IV42 may inversely buffer an output signal of the NOR gate NOR41 to output the inversely buffered signal. The NAND gate NAND41 may perform a NAND operation of an output signal of the exclusive NOR gate XNOR41 and an output signal of the inverter IV42 to output a result of the NAND operation. The inverter IV43 may inversely buffer an output signal of the NAND gate NAND41 to output the inversely buffered signal as the second subtraction address IADD_DN<2>. For example, if the first active address IADD_ACT<1> has a logic high level, the second subtraction address generation circuit 42 may buffer the second active address IADD_ACT<2> to generate the second subtraction address IADD_DN<2>. If the first active address IADD_ACT<1> has a logic low level and the third active address IADD_ACT<3> has a logic high level, the second subtraction address generation circuit 42 may inversely buffer the second active address IADD_ACT<2> to generate the second subtraction address IADD_DN<2>. If the first active address IADD_ACT<1> and the third active address IADD_ACT<3> have a logic low level, the second subtraction address generation circuit 42 may generate the second subtraction address IADD_DN<2> having a logic low level.

The third subtraction address generation circuit 43 may include a logic gate, for example but not limited to, a NOR gate NOR42, inverters IV44 and IV45, and a NAND gate NAND42. The NOR gate NOR42 may perform a NOR operation of the first active address IADD_ACT<1> and the second active address IADD_ACT<2> to output a result of the NOR operation. The inverter IV44 may inversely buffer an output signal of the NOR gate NOR42 to output the inversely buffered signal. The NAND gate NAND42 may perform a NAND operation of an output signal of the inverter IV44 and the third active address IADD_ACT<3> to output a result of the NAND operation. The inverter IV45 may inversely buffer an output signal of the NAND gate NAND42 to output the inversely buffered signal as the third subtraction address IADD_DN<3>. For example, if the first active address IADD_ACT<1> and the second active address IADD_ACT<2> have a logic low level, the third subtraction address generation circuit 43 may generate the third subtraction address IADD_DN<3> having a logic low level. If at least one of the first active address IADD_ACT<1> and the second active address IADD_ACT<2> have a logic high level, the third subtraction address generation circuit 43 may buffer the third active address IADD_ACT<3> to generate the third subtraction address IADD_DN<3>.

For example, the address subtraction circuit 311 may subtract one bit from the first to third active addresses IADD_ACT<1:3> to generate the first to third subtraction addresses IADD_DN<1:3>. If the first to third active addresses IADD_ACT<1:3> have a logic level combination of "000", the address subtraction circuit 311 may generate the first to third subtraction addresses IADD_DN<1:3> having a logic level combination of "001".

Figure 5:
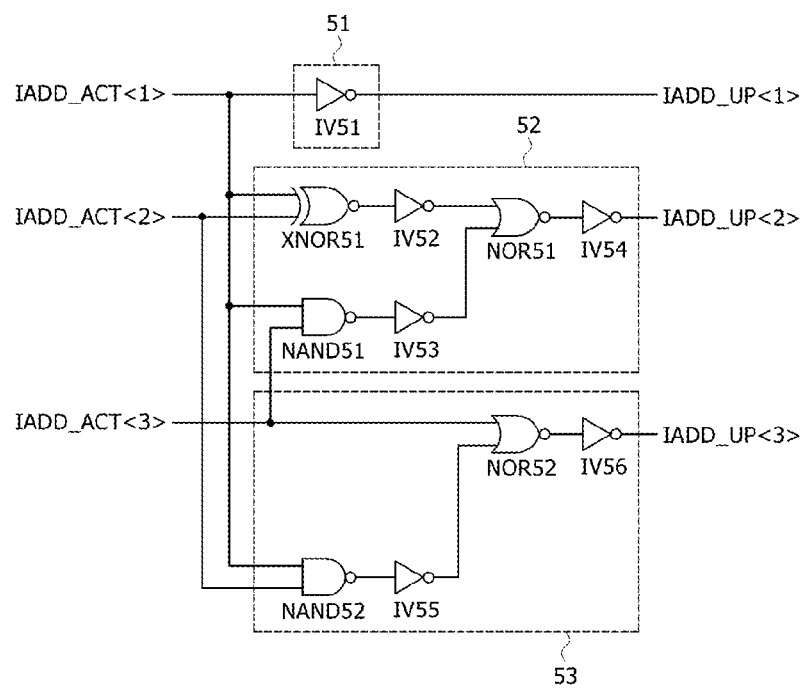
FIG. 5 is a circuit diagram of an address addition circuit included in the address comparison circuit illustrated in FIG. 3.

Referring to FIG. 5, the address addition circuit 312 may include a first addition address generation circuit 51, a second addition address generation circuit 52, and a third addition address generation circuit 53.

The first addition address generation circuit 51 may include an inverter IV51. The inverter IV51 may inversely buffer the first active address IADD_ACT<1> to generate the first addition address IADD_UP<1>.

The second addition address generation circuit 52 may include logic gates, for example but not limited to, an exclusive NOR gate XNOR51, inverters IV52, IV53 and IV54, a NAND gate NAND51, and a NOR gate NOR51. The exclusive NOR gate XNOR51 may perform an exclusive NOR operation of the first active address IADD_ACT<1> and the second active address IADD_ACT<2> to output a result of the exclusive NOR operation. The inverter IV52 may inversely buffer an output signal of the exclusive NOR gate XNOR51 to output the inversely buffered signal. The NAND gate NAND51 may perform a NAND operation of the first active address IADD_ACT<1> and the third active address IADD_ACT<3> to output a result of the NAND operation. The inverter IV53 may inversely buffer an output signal of the NAND gate NAND51 to output the inversely buffered signal. The NOR gate NOR51 may perform a NOR operation of an output signal of the inverter IV52 and an output signal of the inverter IV53 to output a result of the NOR operation. The inverter IV54 may inversely buffer an output signal of the NOR gate NOR51 to output the inversely buffered signal as the second addition address IADD_UP<2>. For example, if the first active address IADD_ACT<1> has a logic low level, the second addition address generation circuit 52 may buffer the second active address IADD_ACT<2> to generate the second addition address IADD_UP<2>. If the first active address IADD_ACT<1> has a logic high level and the third active address IADD_ACT<3> has a logic low level, the second addition address generation circuit 52 may inversely buffer the second active address IADD_ACT<2> to generate the second addition address IADD_UP<2>. If the first active address IADD_ACT<1> and the third active address IADD_ACT<3> have a logic high level, the second addition address generation circuit 52 may generate the second addition address IADD_UP<2> having a logic high level.

The third addition address generation circuit 53 may include logic gates, for example but not limited to, a NAND gate NAND52, inverters IV55 and IV56, and a NOR gate NOR52. The NAND gate NAND52 may perform a NAND operation of the first active address IADD_ACT<1> and the second active address IADD_ACT<2> to output a result of the NAND operation. The inverter IV55 may inversely buffer an output signal of the NAND gate NAND52 to output the inversely buffered signal. The NOR gate NOR52 may perform a NOR operation of an output signal of the inverter IV55 and the third active address IADD_ACT<3> to output a result of the NOR operation. The inverter IV56 may inversely buffer an output signal of the NOR gate NOR52 to output the inversely buffered signal as the third addition address IADD_UP<3>. For example, if the first active address IADD_ACT<1> and the second active address IADD_ACT<2> have a logic high level, the third addition address generation circuit 53 may generate the third addition address IADD_UP<3> having a logic high level. If at least one of the first active address IADD_ACT<1> and the second active address IADD_ACT<2> has a logic low level, the third addition address generation circuit 53 may buffer the third active address IADD_ACT<3> to generate the third addition address IADD_UP<3>.

For example, the address addition circuit 312 may add one bit to the first to third active addresses IADD_ACT<1:3> to generate the first to third addition address IADD_UP<1:3>. If the first to third active addresses IADD_ACT<1:3> have a logic level combination of "111", the address addition circuit 312 may generate the first to third addition address IADD_UP<1:3> having a logic level combination of "110".

Figure 6:
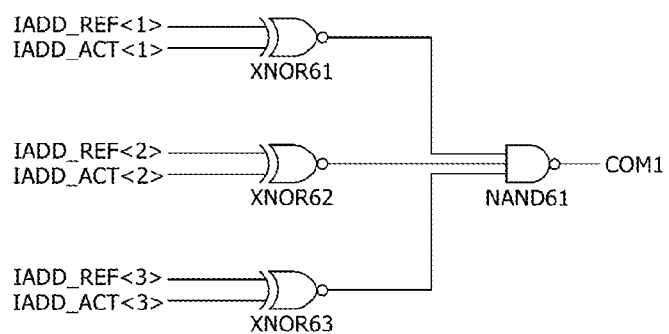
FIG. 6 is a circuit diagram of a first comparison circuit included in the address comparison circuit illustrated in FIG. 3.

Referring to FIG. 6, the first comparison circuit 321 may include logic gates, for example but not limited to, exclusive NOR gates XNOR61, XNOR62 and XNOR63, and a NAND gate NAND61. The exclusive NOR gate XNOR61 may perform an exclusive NOR operation of the first refresh address IADD_REF<1> and the first active address IADD_ACT<1> to output a result of the exclusive NOR operation. The exclusive NOR gate XNOR62 may perform an exclusive NOR operation of the second refresh address IADD_REF<2> and the second active address IADD_ACT<2> to output a result of the exclusive NOR operation. The exclusive NOR gate XNOR63 may perform an exclusive NOR operation of the third refresh address IADD_REF<3> and the third active address IADD_ACT<3> to output a result of the exclusive NOR operation. The NAND gate NAND61 may perform a NAND operation of output signals of the exclusive NOR gates XNOR61, XNOR62 and XNOR63 to generate the first comparison signal COM1. For example, the first comparison circuit 321 may compare the first to third refresh addresses IADD_REF<1:3> with the first to third active addresses IADD_ACT<1:3> to output the first comparison signal COM1 having a logic low level if the first refresh address IADD_REF<1> is the same as the first active address IADD_ACT<1>, the second refresh address IADD_REF<2> is the same as the second active address IADD_ACT<2>, and the third refresh address IADD_REF<3> is the same as the third active address IADD_ACT<3>. The second comparison circuit 322 and the third comparison circuit 323 may have substantially the same configuration as the first comparison circuit 321 except input signals thereof. Accordingly, descriptions of the second comparison circuit 322 and the third comparison circuit 323 will be omitted hereinafter to avoid duplicate explanation.

Figure 7:
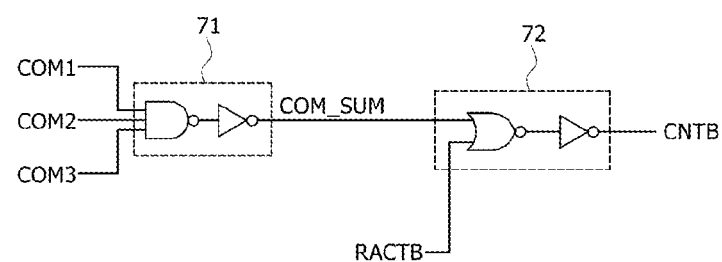
FIG. 7 is a circuit diagram of a control signal output circuit included in the address comparison circuit illustrated in FIG. 3.

Referring to FIG. 7, the control signal output circuit 324 may include a first logic circuit 71 and a second logic circuit 72. The first logic circuit 71 may synthesize the first to third comparison signals COM1, COM2, and COM3 to output the synthesized signal. If at least one of the first to third comparison signals COM1, COM2 and COM3 has a logic low level, the first logic circuit 71 may generate a synthesis comparison signal COM_SUM having a logic low level. The second logic circuit 72 may buffer the synthesis comparison signal COM_SUM in response to the internal operation period signal RACTB to output the buffered signal as the control signal CNTB. The second logic circuit 72 may buffer the synthesis comparison signal COM_SUM to output the buffered signal as the control signal CNTB in response to the internal operation period signal RACTB which is enabled to have a logic low level during a time period in which the internal operation is performed. The second logic circuit 72 may generate the control signal CNTB which is disabled to have a logic high level in response to the internal operation period signal RACTB which is disabled to have a logic high level.

Figure 8:
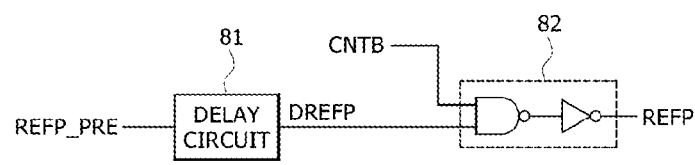
FIG. 8 is a circuit diagram of a refresh signal generation circuit included in the semiconductor system illustrated in FIG. 1.

Referring to FIG. 8, the refresh signal generation circuit 164 may include a delay circuit 81 and a refresh signal output circuit 82. The delay circuit 81 may delay the pre-refresh signal REFP_PRE to a predetermined point of time to generate a delayed refresh signal DREFP. The predetermined point of time may be set to be a point of time that the control signal CNTB is normally generated by comparing the active addresses IADD_ACT<1:N> with the refresh addresses IADD_REF<1:N>.

Figure 9:
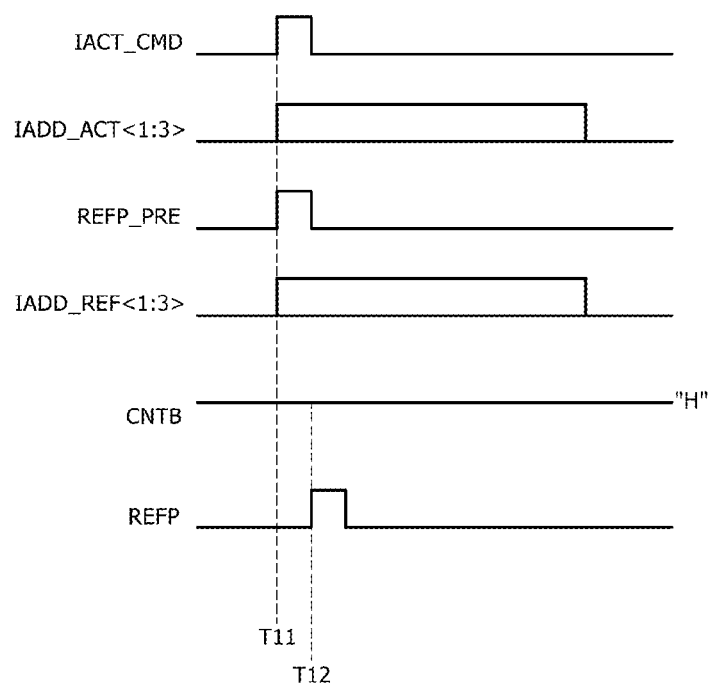
FIG. 9 to FIG. 11 are timing diagrams illustrating representations of examples of an operation of the semiconductor system illustrated in FIGS. 1 to 8.

FIG. 9 is a timing diagram illustrating an example in which the refresh operation is performed because a memory block corresponding to the active addresses IADD_ACT<1:N> is inconsistent with or is not immediately adjacent to a memory block corresponding to the refresh addresses IADD_REF<1:N> while the internal operation is performed.

First, at a point of time T11, the pulse of the internal active command IACT_CMD may be generated by the command decoder 13 and the active addresses IADD_ACT<1:N> may be generated by the address input circuit 14 to put the semiconductor system in the internal operation. The pre-refresh signal generation circuit 161 may generate the pulse of the pre-refresh signal REFP_PRE in response to the internal active command IACT_CMD at the point of time T11. The refresh address generation circuit 162 may generate the refresh addresses IADD_REF<1:N> in response to the pulse of the pre-refresh signal REFP_PRE at the point of time T11. The address comparison circuit 163 may compare the first to third active addresses IADD_ACT<1:3> with the first to third refresh addresses IADD_REF<1:3> to generate the control signal CNTB which is disabled to have a logic high level, if a memory block corresponding to the first to third active addresses IADD_ACT<1:3> is inconsistent with or is not immediately adjacent to a memory block corresponding to the first to third refresh addresses IADD_REF<1:3>. The refresh signal generation circuit 164 may generate a pulse of the refresh signal REFP at a point of time T12 that the pre-refresh signal REFP_PRE is delayed by a predetermined time period, in response to the control signal CNTB having a logic high level. Hence, the internal operation control circuit 15 may perform the internal operation in response to the pulse of the internal active command IACT_CMD and the active addresses IADD_ACT<1:N>, and the refresh operation control circuit 17 may perform the refresh operation in response to the pulse of the refresh signal REFP and the refresh addresses IADD_REF<1:N>.

Figure 10:
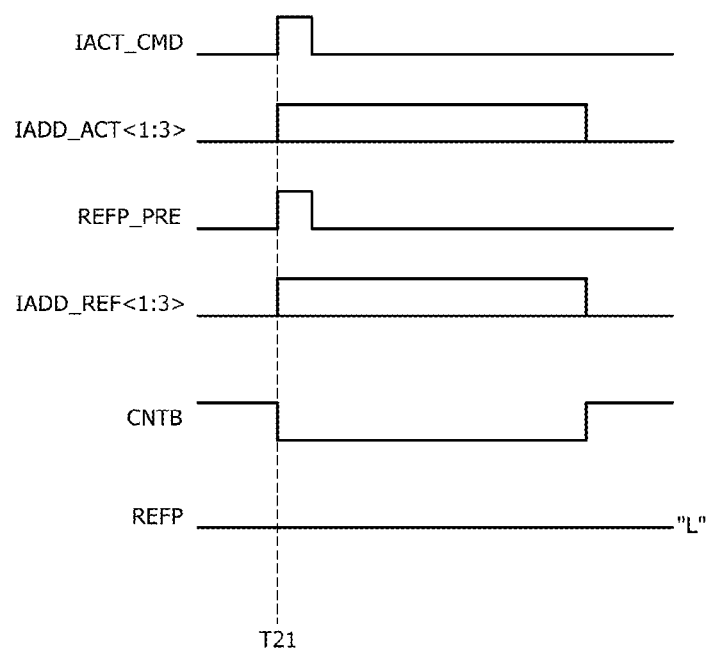

FIG. 10 is a timing diagram illustrating an example in which the refresh operation is not performed because a memory block corresponding to the active addresses IADD_ACT<1:N> is consistent with or immediately adjacent to a memory block corresponding to the refresh addresses IADD_REF<1:N> while the internal operation is performed.

First, at a point of time T21, the pulse of the internal active command IACT_CMD may be generated by the command decoder 13 and the active addresses IADD_ACT<1:N> may be generated by the address input circuit 14 to put the semiconductor system in the internal operation. The pre-refresh signal generation circuit 161 may generate the pulse of the pre-refresh signal REFP_PRE in response to the internal active command IACT_CMD at the point of time T21. The refresh address generation circuit 162 may generate the refresh addresses IADD_REF<1:N> in response to the pulse of the pre-refresh signal REFP_PRE at the point of time T21. The address comparison circuit 163 may compare the first to third active addresses IADD_ACT<1:3> with the first to third refresh addresses IADD_REF<1:3> to generate the control signal CNTB which is enabled to a logic low level, if a memory block corresponding to the first to third active addresses IADD_ACT<1:3> is consistent with or immediately adjacent to a memory block corresponding to the first to third refresh addresses IADD_REF<1:3>. The refresh signal generation circuit 164 may block generation of a pulse of the refresh signal REFP in response to the control signal CNTB having a logic low level. Hence, the internal operation control circuit 15 may perform the internal operation in response to the pulse of the internal active command IACT_CMD and the active addresses IADD_ACT<1:N>, and the refresh operation control circuit 17 may not perform the refresh operation.

Figure 11:
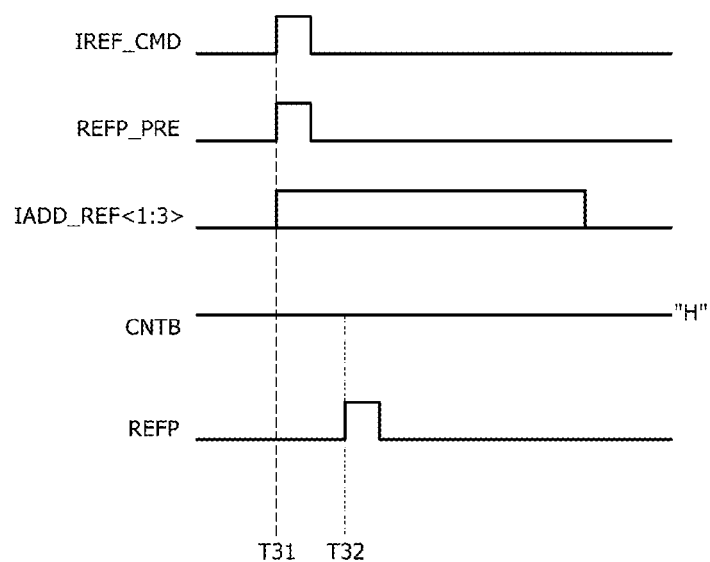

FIG. 11 is a timing diagram illustrating an example in which the refresh operation is performed in response to the refresh command provided by an external device.

First, at a point of time T31, the pulse of the internal refresh command IREF_CMD may be generated by the command decoder 13. The pre-refresh signal generation circuit 161 may generate the pulse of the pre-refresh signal REFP_PRE in response to the internal refresh command IREF_CMD at the point of time T31. The refresh address generation circuit 162 may generate the refresh addresses IADD_REF<1:N> in response to the pulse of the pre-refresh signal REFP_PRE at the point of time T31. The address comparison circuit 163 may generate the control signal CNTB which is disabled to have a logic high level because the internal operation is not performed. The refresh signal generation circuit 164 may generate a pulse of the refresh signal REFP at a point of time T32 that the pre-refresh signal REFP_PRE is delayed by a predetermined time period, in response to the control signal CNTB having a logic high level. Hence, the refresh operation control circuit 17 may perform the refresh operation in response to the pulse of the refresh signal REFP and the refresh addresses IADD_REF<1:N>.

As described above, a semiconductor system according to an embodiment may internally generate the refresh addresses IADD_REF<1:N> to simultaneously perform the internal operation and the refresh operation, if the internal operation such as a read operation or a write operation is performed in response to the internal active command IACT_CMD. If a memory block corresponding to the active addresses IADD_ACT<1:N> is consistent with or immediately adjacent to a memory block corresponding to the refresh addresses IADD_REF<1:N>, the semiconductor system may stop the refresh operation to prevent an abnormal operation that occurs due to a sense amplifier that two adjacent memory blocks share with each other.

Figure 12:
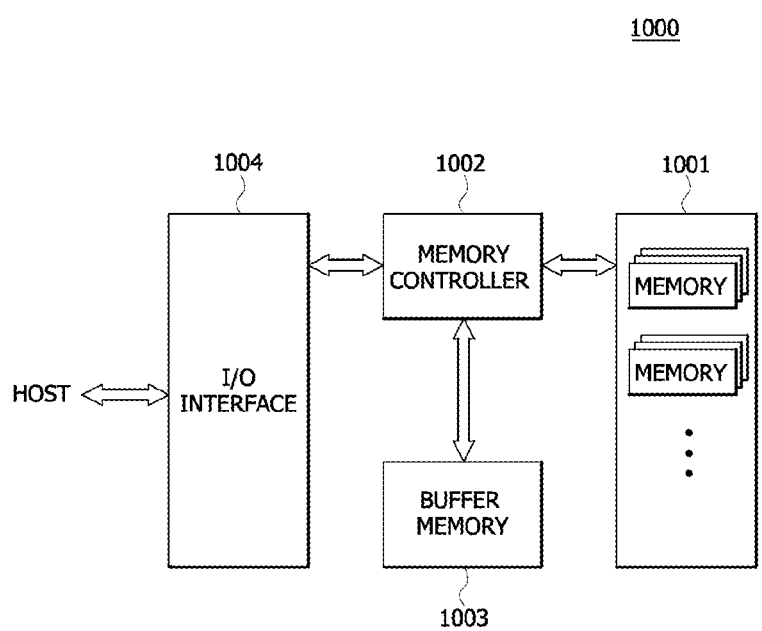
FIG. 12 is a block diagram illustrating a representation of an example of a configuration of an electronic system employing the semiconductor device or the semiconductor system illustrated in FIG. 1 to FIG. 11.

The second semiconductor device 12 or the semiconductor system described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002, according to a control signal generated from the memory controller 1002. The data storage unit 1001 may include the second semiconductor device 12 illustrated in FIG. 1. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 11 illustrated in FIG. 1. Although FIG. 12 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. For example, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. For example, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
   a first semiconductor device configured for outputting an external command and external addresses; and
   a second semiconductor device configured for generating an internal active command based on the external command, configured for generating active addresses based on the external addresses, configured for generating a refresh signal and refresh addresses based on the internal active command, configured for performing an internal operation based on the internal active command and the active addresses, and configured for performing a refresh operation based on the refresh signal and the refresh addresses, wherein the second semiconductor device includes:
an internal operation control circuit configured for performing the internal operation based on the internal active command and the active addresses;
a refresh control circuit configured for generating the refresh addresses and the refresh signal based on the internal active command or an internal refresh command; and
a refresh operation control circuit configured for performing a refresh operation based on the refresh signal and the refresh addresses, and
wherein the refresh control circuit includes:
an address comparison circuit configured for generating a control signal according to a comparison result of the active addresses and the refresh addresses; and
a refresh signal generation circuit configured for buffering a pre-refresh signal based on the control signal to generate the refresh signal.

2. The system of claim 1, wherein the internal operation includes a read operation or a write operation.

3. The system of claim 1, wherein the refresh addresses are counted based on the internal active command.

4. The system of claim 1, wherein the refresh signal is generated based on the internal active command and the internal refresh command.

5. The system of claim 1, wherein a pulse of the refresh signal is not generated according to a comparison result of the active addresses and the refresh addresses.

6. The system of claim 5, wherein the pulse of the refresh signal is not generated if a memory block corresponding to the active addresses is the same as a memory block corresponding to the refresh addresses.

7. The system of claim 5, wherein the pulse of the refresh signal is not generated if a memory block corresponding to the active addresses is immediately adjacent to a memory block corresponding to the refresh addresses.

8. The system of claim 1, wherein the second semiconductor device further includes:
a command decoder configured for generating the internal active command or the internal refresh command based on the external command.

9. The system of claim 1, wherein the refresh control circuit further includes:
a pre-refresh signal generation circuit configured for generating the pre-refresh signal based on the internal active command or the internal refresh command; and
a refresh address generation circuit configured for generating the refresh addresses counted based on the pre-refresh signal.

10. The system of claim 9, wherein the control signal is enabled if a memory block corresponding to the active addresses is consistent with or is immediately adjacent to a memory block corresponding to the refresh addresses.

11. The system of claim 9, wherein the refresh signal generation circuit blocks generation of the pulse of the refresh signal if the control signal is enabled.

12. The system of claim 9, wherein the address comparison circuit includes:
an address adjustment circuit configured for generating addition addresses and subtraction addresses based on the active addresses; and
a control signal generation circuit configured for comparing the active addresses, the addition addresses and the subtraction addresses with the refresh addresses to generate the control signal.

13. The system of claim 12, wherein the addition addresses and the subtraction addresses assign memory blocks immediately adjacent to a memory block corresponding to the active addresses.

14. A semiconductor device comprising:
an internal operation control circuit configured for performing an internal operation based on an internal active command and active addresses;
a refresh control circuit configured for generating a refresh signal and refresh addresses based on the internal active command; and
a refresh operation control circuit configured for performing a refresh operation based on the refresh signal and the refresh addresses,
wherein the refresh control circuit includes:
an address comparison circuit configured for generating a control signal according to a comparison result of the active addresses and the refresh addresses; and
a refresh signal generation circuit configured for buffering a pre-refresh signal based on the control signal to generate the refresh signal.

15. The device of claim 14, wherein the refresh addresses are counted based on the internal active command.

16. The device of claim 14, wherein a pulse of the refresh signal is not generated according to a comparison result of the active addresses and the refresh addresses.

17. The device of claim 16, wherein a pulse of the refresh signal is not generated if a memory block corresponding to the active addresses is the same as or is immediately adjacent to a memory block corresponding to the refresh addresses.

18. The device of claim 14, wherein the refresh control circuit further includes:
a pre-refresh signal generation circuit configured for generating the pre-refresh signal based on the internal active command or an internal refresh command; and
a refresh address generation circuit configured for generating the refresh addresses counted based on the pre-refresh signal.

19. The device of claim 18, wherein the control signal is enabled if a memory block corresponding to the active addresses is consistent with or is immediately adjacent to a memory block corresponding to the refresh addresses and wherein the refresh signal generation circuit blocks generation of the refresh signal if the control signal is enabled.

20. A semiconductor device comprising:
an address comparison circuit configured for generating a control signal according to a comparison result of refresh addresses and active addresses, wherein the refresh addresses is generated based on an internal active command;
a refresh signal generation circuit configured for generating a refresh signal based on the control signal; and
a refresh operation control circuit configured for performing a refresh operation based on the refresh signal and the refresh addresses.

21. The device of claim 20, wherein the control signal is enabled if a memory block corresponding to the active addresses is consistent with or is immediately adjacent to a memory block corresponding to the refresh addresses and wherein the refresh signal generation circuit blocks generation of the refresh signal if the control signal is enabled.

22. The device of claim 20, wherein the address comparison circuit includes:
an address adjustment circuit configured for generating addition addresses and subtraction addresses based on the active addresses; and a control signal generation circuit configured for comparing the active addresses, the addition addresses and the subtraction addresses with the refresh addresses to generate the control signal.

23. The device of claim 20, further comprising an internal operation control circuit configured for performing an internal operation based on the internal active command and the active addresses.

* * * * *